United States Patent
Wasyluk et al.

(10) Patent No.: US 8,658,543 B2
(45) Date of Patent: Feb. 25, 2014

(54) METHODS FOR PFET FABRICATION USING APM SOLUTIONS

(75) Inventors: Joanna Wasyluk, Dresden (DE); Stephan Kronholz, Dresden (DE); Yew-Tuck Chow, Dresden (DE); Richard J. Carter, Dresden (DE); Berthold Reimer, Dresden (DE); Kai Tern Sih, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 3 days.

(21) Appl. No.: 13/368,055

(22) Filed: Feb. 7, 2012

(65) Prior Publication Data

US 2013/0203244 A1 Aug. 8, 2013

(51) Int. Cl.
*H01L 21/302* (2006.01)

(52) U.S. Cl.
USPC ........... 438/734; 438/689; 438/704; 438/745; 438/753; 438/756; 257/E21.618; 257/E21.633

(58) Field of Classification Search
None
See application file for complete search history.

(56) References Cited

U.S. PATENT DOCUMENTS

| | | | |
|---|---|---|---|
| 7,241,700 B1 * | 7/2007 | En et al. | 438/745 |
| 7,344,999 B2 | 3/2008 | Mun et al. | |
| 7,354,868 B2 | 4/2008 | Kwon et al. | |
| 2008/0079086 A1 * | 4/2008 | Jung et al. | 257/369 |
| 2008/0308872 A1 * | 12/2008 | Bu et al. | 257/369 |
| 2010/0068874 A1 | 3/2010 | Chang | |

* cited by examiner

*Primary Examiner* — Julio J Maldonado
*Assistant Examiner* — Joseph Galvin, III
(74) *Attorney, Agent, or Firm* — Ingrassia Fisher & Lorenz, P.C.

(57) ABSTRACT

A method for fabricating an integrated circuit is disclosed that includes, in accordance with an embodiment, providing an integrated circuit comprising a p-type field effect transistor (pFET), recessing a surface region of the pFET using an ammonia-hydrogen peroxide-water (APM) solution to form a recessed pFET surface region, and depositing a silicon-based material channel on the recessed pFET surface region.

7 Claims, 3 Drawing Sheets

METHODS FOR PFET FABRICATION USING APM SOLUTIONS

TECHNICAL FIELD

The present invention generally relates to methods for fabricating an integrated circuit, and more particularly relates to methods for p-type field effect transistor (pFET) fabrication using ammonia-hydrogen peroxide-water (APM) solutions.

BACKGROUND

As FET (field effect transistor) devices are being scaled down, the technology becomes more complex, and changes in device structures and new fabrication methods are needed to maintain the expected performance improvements from one successive device generation to the next. Performance may be enhanced by independent optimization of device parameters for the pFET and the nFET devices.

Standard components of a FET are the source, the drain, the body in-between the source and the drain, and the gate. The gate overlies the body and is capable of inducing a conducting channel in the body between the source and the drain. The gate is typically separated from the body by the gate insulator, or gate dielectric. Depending whether the "on state" current in the channel is carried by electrons or by holes, the FET comes in two kinds: as nFET or pFET. It is also understood that frequently nFET and pFET devices are used together in circuits. Such nFET, pFET combination circuits may find application in analog and digital integrated circuits.

A common material used in microelectronics is silicon (Si), or more broadly, Si-based materials such as various alloys of Si. Si-based materials commonly used in microelectronics are, for instance, the alloys of Si with other elements of the $IV^{th}$ group of the periodic table of elements, such as silicon germanium (SiGe).

In the fabrication of integrated circuits, one technique that has been found to be advantageous for the pFET device, as well as other FET devices, is to have a channel region. In high-k/metal-gate technologies, SiGe may be used as the pFET channel material to enhance electron mobility in the channel. The SiGe channel may be grown using selective epitaxial growth techniques. When using selective epitaxial growth for channel materials on a desired device, a hard-mask material such as silicon dioxide ($SiO_2$) or silicon nitride ($Si_3N_4$) may be used to protect against growth of new channel material on other parts of the circuit, such as an nFET device. Thereby, growth of the SiGe channel occurs only on crystalline material, not the oxides or nitrides. The hard-mask material is then removed after growth of the eSiGe channel is complete.

FIGS. 1-3 illustrate an exemplary fabrication technique currently known in the art for pFET fabrication with a SiGe channel. As shown in FIG. 1, a complementary metal-oxide semiconductor (CMOS) FET circuit is provided that includes a pFET 30, an nFET 35, and a shallow trench isolation (STI) feature 15 between the pFET 30 and the nFET 35. The STI 15, made of a dielectric material such a silicon dioxide, provides electrical isolation between the adjacent semiconductor device components. The nFET 35 includes a hard-mask material 10, such as a hard-mask oxide, to protect the nFET 35 during the growth of channel material on the neighboring pFET 30. Both the pFET 30 and the nFET 35 include an "active" surface 31, 36 respectively, where current flow occurs.

At FIG. 2, the native oxide 20 overlaying the pFET 30 (e.g., silicon dioxide) is removed with an oxide etchant, such as hydrofluoric acid (HF), to expose the pFET active surface 31. The oxide etchant also etches a portion of the STI 15 and the hard-mask material 10. At FIG. 3, SiGe is epitaxially grown on the pFET 30 to form a SiGe channel 40. As a result of the growth of the SiGe, however, there is a "step-height" difference 47 between the pFET active surface 31, which is now on top of the SiGe channel 40, and the nFET active surface 36 (shown as distance between parallel dashed lines and shown by double-headed arrow 47). Different size STI divots 45 (amount of STI oxide "pull-down" or height difference immediately next to the pFET SiGe channel 40) may also occur between nFET and pFET devices, due to the formation of the SiGe channel 40 on the Si material only, and not on oxides or nitrides. Step-height differences 47 and divots 45 can create structural topography problems in downstream processing, such as missing high-K material, also known as an encapsulation breach. Encapsulation breaches can result in a lower yielding fabrication process.

As such, there is a need in the art for improved integrated circuit fabrication techniques. Further, there is a need in the art for integrated circuit fabrication techniques that reduce or eliminate the amount and size of step-height differences and divots produced as a result of SiGe channel growth on a pFET. These and other desirable features are provided and will become apparent from the subsequent detailed description and the appended claims, taken in conjunction with the accompanying drawings and the foregoing technical field and background.

BRIEF SUMMARY

Methods are provided for fabricating an integrated circuit. In accordance with one embodiment, a method includes providing an integrated circuit comprising a p-type field effect transistor (pFET), recessing a surface region of the pFET using an ammonia-hydrogen peroxide-water (APM) solution to form a recessed pFET surface region, and depositing a silicon-based material channel on the recessed pFET surface region. Recessing the surface region of the pFET using the APM solution to form the recessed pFET surface region may include recessing the surface region of the pFET using the APM solution to form a recessed pFET surface region having a depth between about 4 nm to about 8 nm.

In accordance with a further embodiment, a method includes providing an integrated circuit, the integrated circuit including a p-type field effect transistor (pFET), an n-type field effect transistor (nFET), and a shallow trench isolation feature (STI) between the pFET and the nFET and recessing a surface region of the pFET using an ammonia-hydrogen peroxide-water (APM) solution to form a recessed pFET surface region. The APM solution has a relative concentration of ammonia to hydrogen peroxide of between about 1:1 to about 1:10, the APM solution has a relative concentration of ammonia to water of between about 1:2 to about 1:20, and the APM solution has a temperature between about 40° C. and about 80° C., such as between about 60° C. and 65° C. The method further includes depositing a SiGe channel on the recessed pFET surface region.

In accordance with yet another embodiment, a method includes providing an integrated circuit, the integrated circuit including a p-type field effect transistor (pFET), an n-type field effect transistor (nFET), and a shallow trench isolation feature (STI) between the pFET and the nFET, removing a native oxide layer from the pFET using hydrogen fluoride, and recessing a surface region of the pFET using an ammonia-hydrogen peroxide-water (APM) solution to form a recessed pFET surface region. The APM solution has a relative concentration of ammonia to hydrogen peroxide of between about 1:1 to about 1:5, the APM solution has a relative concentration of ammonia to water of between about 1:2 to about 1:10, and the APM solution has a temperature between about 40° C. and about 80° C. The method further includes cleaning the pFET using hydrogen fluoride and depositing an SiGe channel on the recessed pFET surface region.

BRIEF DESCRIPTION OF THE DRAWINGS

The present invention will hereinafter be described in conjunction with the following drawing figures, wherein like numerals denote like elements, and wherein.

The Figures presented herein are intended to be broadly illustrative of the methods disclosed herein, and as such are not intended to be to-scale or otherwise exact with regard to the integrated circuits produced in accordance with said method.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

This invention establishes methods for fabricating an integrated circuit wherein the Si material that forms a pFET is recessed to a depth such that upon growth of an SiGe channel on the pFET, there is a reduced or negligible step-height difference between the active pFET and nFET portion of the circuit, and further there is reduced or negligible divot formation at the STI. Si recessing at the pFET is accomplished using an ammonia-hydrogen peroxide-water (APM) solution at concentrations and for times as will be discussed in greater detail below.

FIGS. 4-7 illustrate, in cross section, an exemplary method in accordance with one embodiment of the present invention. As shown therein, at FIG. 4, a complementary metal-oxide semiconductor (CMOS) circuit is provided that includes a pFET 30, an nFET 35, and a shallow trench isolation (STI) feature 15 between the pFET 30 and the nFET 35. An STI 15 is provided between the pFET 30 and the nFET 35 to prevent electrical current leakage between the adjacent semiconductor device components. The nFET 35 includes a hard-mask material 10, such as a hard-mask oxide, to protect the nFET 35 during the deposition of channel material on the neighboring pFET 30.

Figure 5:
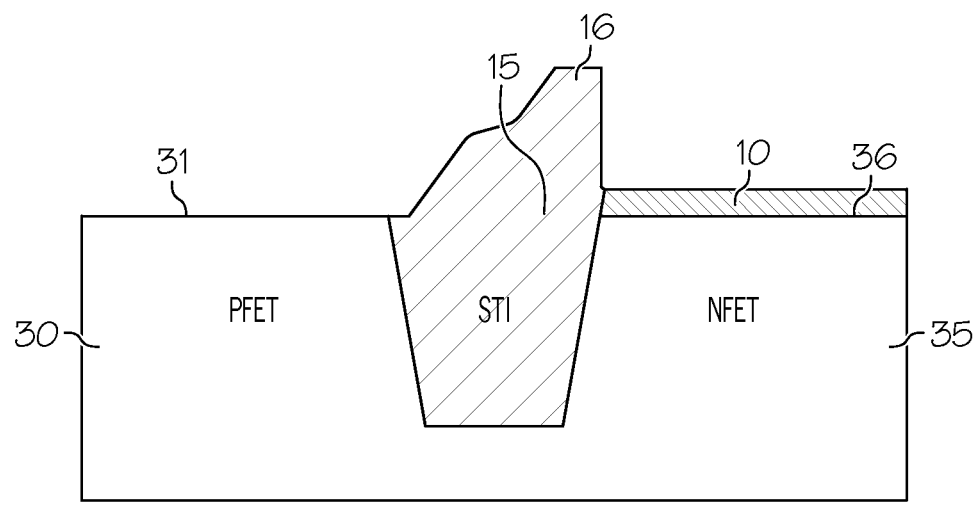

At FIG. 5, the native oxide 20, which is a product of previous processing steps, such as silicon dioxide, is removed with an oxide etchant, such as HF. The oxide etchant also etches a portion of the STI 15 and the hard-mask material 10. As shown, the STI 15 also includes a feature 16 including a change in height between the portion directly adjacent to the pFET and the portion direction adjacent to the nFET, which is formed in part as a result of processing subsequent to forming the hard-mask on the nFET.

Figure 6:
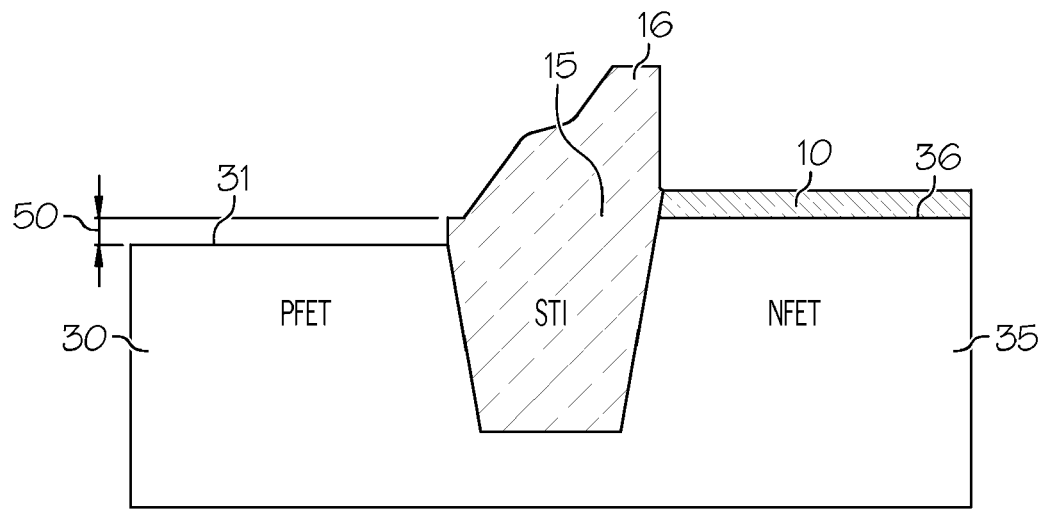

At FIG. 6, an APM solution is applied to the Si of the pFET 30 for recessing the surface of the pFET region 30 to a desired depth. The APM solution reacts chemically with the Si, and dissolves the Si to provide the recess 50. APM solutions are provided in concentrations with reference to the ammonia component thereof. For example, an APM solution may be given as 1:x:y, wherein "1" represents the ratio by mole fraction of ammonia present in the solution, "x" represents the ratio of hydrogen peroxide present in the solution with reference to the ammonia, and "y" represents the ratio of water present in the solution with reference to the ammonia. It has been discovered that the Si recessing process achieves the best controllability, consistency, and uniformity when the APM is applied in a concentration wherein "x" is between about 1 to about 10, and wherein "y" is between about 2 to about 20. More preferably, "x" is between about 1 to about 5, and "y" is between about 5 to about 20. An exemplary concentration is about 1:1:5. A further exemplary concentration is about 1:4:20. It has further been discovered that the Si recessing process achieves desirable controllability, consistency, and uniformity when the APM solution is applied at a temperature between about 40° C. and about 80° C., such as between about 60° C. and about 65° C. An exemplary temperature is about 60° C. A further exemplary temperature is about 65° C.

In order to avoid the detrimental formation of step-height differences and divots, the Si of the pFET 30 is recessed to a depth sufficient to allow a subsequently-deposited silicon-based material channel, for example a SiGe channel, to achieve a height approximately equal to the height of the active nFET surface 36 (i.e., the resulting active pFET surface 31 and the active nFET surface 36 will be approximately equal or co-planar with respect to one another). As such, the pFET 30 is preferably recessed to a depth between about 2 nm to about 20 nm, and more preferably between about 4 nm and 8 nm. Exemplary recesses 50 include depths of 6 nm and 8 nm. The time period required to achieve such a recess 50 will depend upon the concentration of APM solution used and the desired recess depth. However, it has been found that, using the ranges of concentrations and temperatures described above, times ranging between about 5 minutes and about 60 minutes, or more preferably between about 15 minutes and 50 minutes, are desirable for achieving a sufficient pFET Si recess 50. Exemplary time periods include about 15 minutes, about 25 minutes, and about 50 minutes. After recessing the pFET 30, the pFET 30 may optionally be cleaned using another HF solution to remove an impurities or imperfections on the surface thereof.

Figure 1:
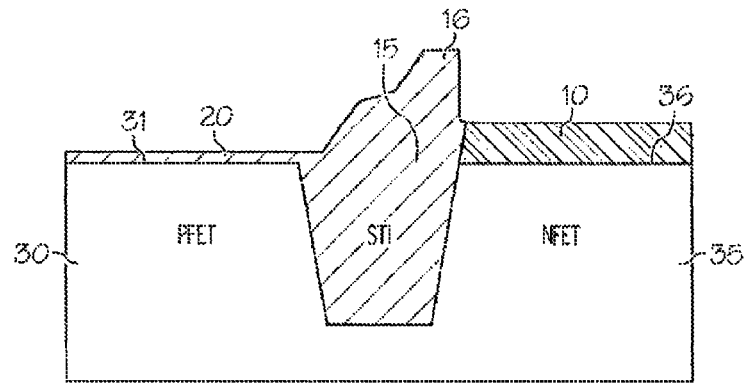
FIGS. 1-3 are cross-sectional views of an integrated circuit illustrating method steps in the fabrication of the integrated circuit with an SiGe channel that can result in step-height differences and divot formation.
Figure 2:
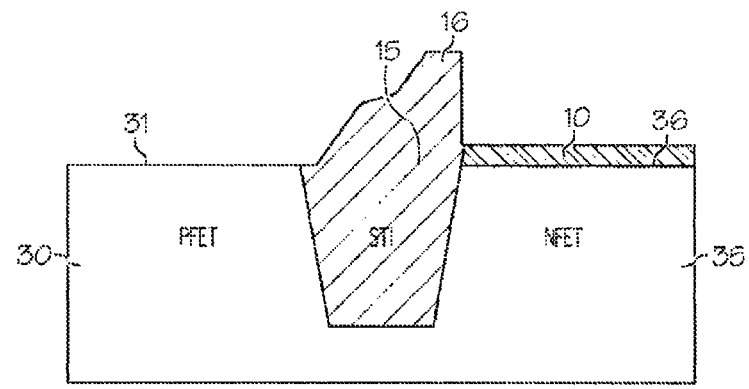
Figure 3:
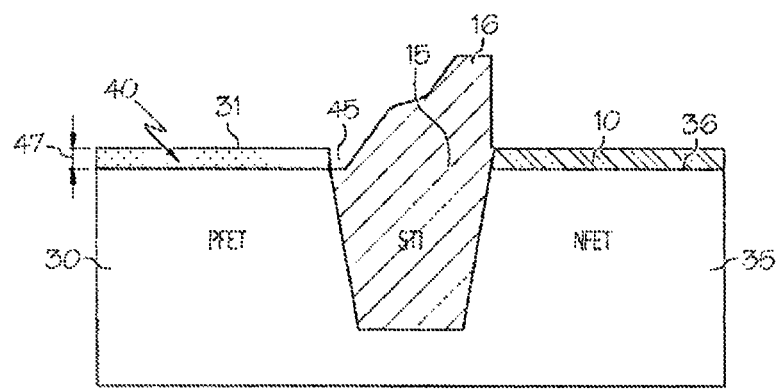
Figure 4:
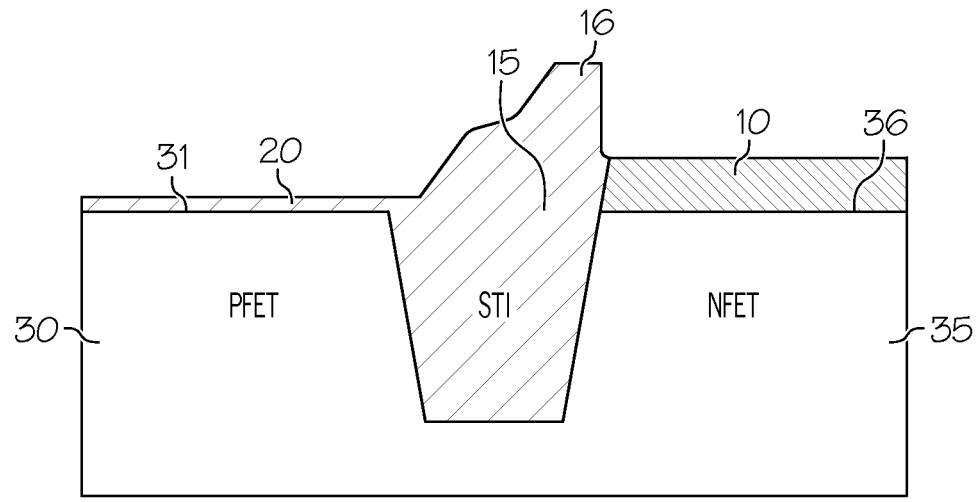
FIGS. 4-7 are cross-sectional views of an integrated circuit illustrating method steps in the fabrication of the integrated circuit with a SiGe channel using an ammonia-hydrogen peroxide-water (APM) solution.
Figure 7:
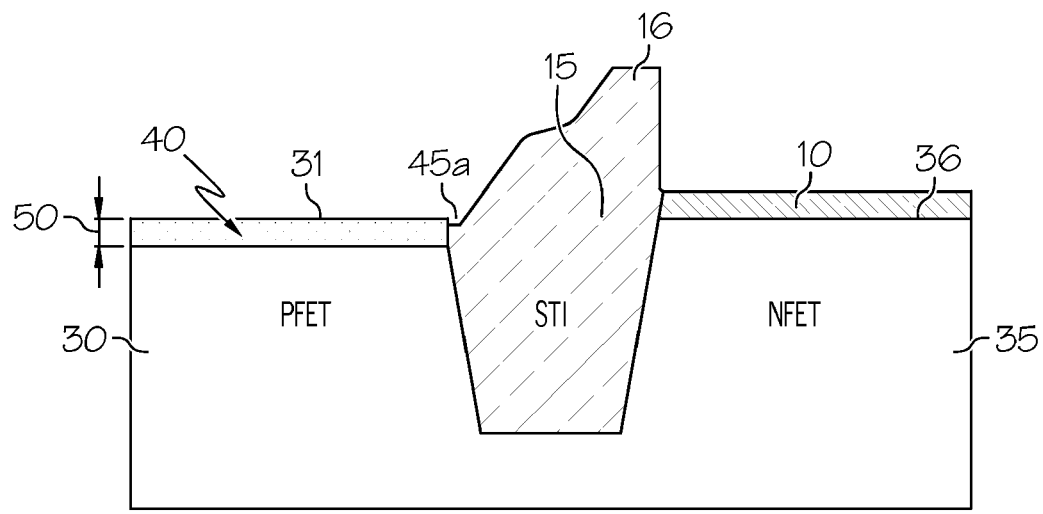

At FIG. 7, SiGe is deposited on the pFET 30 to form an SiGe channel 40. As shown, due to the recess 50 in the pFET 30, the deposited SiGe channel 40 (i.e., the pFET active surface 31) reaches a height roughly equivalent to that of the active nFET surface 36, desirably resulting in a minimal or negligible step-height difference. Further, the deposited SiGe channel 40 reaches a height roughly equivalent to that of the adjacent STI 15, desirably resulting in minimal or negligible divot formation (a divot 45a is shown, greatly reduced in size as compared to FIG. 3 divot 45). Further processing steps, as will be known to those having ordinary skill in the art, can thereafter be used to remove the hard-mask covering the nFET 35 and the portion of the STI 15 extending to the height of the hard-mask 10.

EXAMPLE

Two substantially identically silicon wafers including CMOS circuits were provided for experimental analysis, nominated Wafer 1 and Wafer 2. Both wafers included a hardmask layer over the nFET. In a first procedure, both wafers were treated with an HF etching solution to remove a native oxide layer existing over the pFET. Thereafter, Wafer 1 was treated with an APM solution having a concentration by mole fraction of 1:4:20 and a temperature of 60° C. The solution was applied for a time period of 50 minutes (in another example, the APM solution had a concentration by mole fraction of 1:1:5 and was applied for a time period of 25 minutes). After which, Wafer 1 was cleaned with another HF solution. The resulting recess in the Si material of the pFET in Wafer 1 was observed to be approximately 6 nm.

SiGe was then epitaxially grown on the pFETs of both wafers, with the Wafer 1 being grown in the recess, and the Wafer 2 being grown without a recess. The depth of epitaxial growth was 6 nm in this example and was uniform across the wafer, although in other examples depth can range from about 6 nm to about 8 nm depending on the epitaxial growth conditions. A cross-sectional sample of both Wafer 1 and Wafer 2 were analyzed using a transmission electron microscope (TEM), focusing on an exemplary CMOS circuit in each wafer. It was observed that the circuit in Wafer 1 did not have a measurable step-height difference between the pFET and the nFET active surface compared to Wafer 2. Furthermore, it was observed that the circuit in Wafer 1 included a divot that was substantially reduced in size as compared to that of Wafer 2. Subsequent performance testing of Wafer 1 and Wafer 2 revealed that Wafer 1 had better aggregate encapsulation characteristics, and therefore would be expected to have a higher yield of integrated circuits therefrom.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit, comprising:

providing a semiconductor substrate configured for forming an integrated circuit comprising a p-type field effect transistor (pFET), the semiconductor substrate having formed thereon a shallow trench isolation feature dividing a first semiconductive region from a second semiconductive region, the first semiconductive region configured for the formation of the pFET transistor thereon and the second semiconductive region configured for the formation of an nFET transistor thereon, the first semiconductive region comprising an active surface and a native oxide layer formed over the active surface, and the second semiconductive region comprising an active surface and an oxide masking layer formed over the active surface, wherein the active surface of the first semiconductive region is substantially parallel to the active surface of the second semiconductive region, and wherein the masking layer extends to a height above the active surface of the second semiconductive region that is higher than a height above the active surface of the first semiconductive region to which the native oxide layer extends;

applying a hydrogen fluoride etching solution to the first and second semiconductive regions of the semiconductor substrate comprising removing the native oxide layer from the first semiconductive region, exposing the active surface of the first semiconductive region, and reducing the height of the oxide masking layer over the second semiconductive region;

applying an APM etching solution to the first and second semiconductive regions of the semiconductor substrate comprising recessing the active surface of the first semiconductive region configured for the formation of the pFET transistor thereon, wherein the APM etching solution comprises an ammonia-hydrogen peroxide-water solution which, when applied to the first semiconductive region forms a recessed pFET surface region and which, when applied to the second semiconductive region does not etch the oxide masking layer, wherein the APM etching solution is defined by the formula "1:x:y", wherein the number "1" represents a molar ratio of ammonia in the APM etching solution, wherein the letter "x" represents a molar ratio of hydrogen peroxide in the APM etching solution, wherein the letter "y" represents a molar ratio of water in the APM etching solution, wherein "x" is from about 1 to about 10, and wherein "y" is from about 2 to about 20;

wherein applying the APM etching solution comprises applying the APM etching solution at a temperature of about 40° C. to about 80° C. and for a time period of about 5 minutes to about 60 minutes;

wherein applying the APM etching solution comprises applying the APM etching solution comprising recessing the active surface of the first semiconductive region to a depth of about 2 nm to about 20 nm to form the recessed pFET surface region; and depositing by epitaxial growth a silicon-based SiGe material in the first semiconductive region to form a channel region on the recessed pFET surface region;

wherein depositing the silicon-based material comprises depositing the silicon-based material to a height that is approximately parallel with the active surface of the second semiconductive region.

2. The method of claim 1, wherein applying the APM solution comprises using an APM solution having a relative concentration of ammonia to hydrogen peroxide wherein "x" is between from about 1 to about 5 and "y" is from about 5 to about 20.

3. The method of claim 2, wherein recessing the active surface of the first semiconductive region using the APM solution comprises recessing the active surface to form a recessed pFET surface region having a depth from about 4nm to about 8 nm.

4. The method of claim 3, wherein recessing the active surface of the first semiconductive region using the APM solution comprises using an APM solution having a temperature from about 60° C. to about 65° C.

5. The method of claim 4, wherein recessing the active surface of the first semiconductive region comprises contacting the semiconductor substrate with the APM solution for a time period from about 15 minutes to about 50 minutes.

6. The method of claim 5, further comprising cleaning the semiconductor substrate subsequent to applying the ammonia-hydrogen peroxide-water (APM) solution.

7. The method of claim 6, wherein cleaning comprises applying a hydrogen fluoride solution to the semiconductor substrate.

* * * * *